United States Patent
Kim et al.

(10) Patent No.: US 12,334,936 B1
(45) Date of Patent: Jun. 17, 2025

(54) SIGNAL RECEIVING CIRCUIT, SIGNAL RECEIVING DEVICE, AND METHOD OF RECOVERING CLOCK OF RECEIVED SIGNAL

(71) Applicant: RAMSCHIP, INC., Seongnam-si (KR)

(72) Inventors: Deoksoo Kim, Seoul (KR); Jaegan Ko, Seongnam-si (KR); Bongjoon Lee, Seongnam-si (KR)

(73) Assignee: RAMSCHIP, INC., Seongnam-si (KR)

( * ) Notice: Subject to any disclaimer, the term of this patent is extended or adjusted under 35 U.S.C. 154(b) by 0 days.

(21) Appl. No.: 18/760,191

(22) Filed: Jul. 1, 2024

(30) Foreign Application Priority Data

Feb. 8, 2024 (KR) ........................ 10-2024-0019317

(51) Int. Cl.
   *H03K 5/14* (2014.01)
   *H03K 5/135* (2006.01)
(52) U.S. Cl.
   CPC ............... *H03K 5/14* (2013.01); *H03K 5/135* (2013.01)
(58) Field of Classification Search
   None
   See application file for complete search history.

(56) References Cited

U.S. PATENT DOCUMENTS

| | | | |
|---|---|---|---|
| 6,236,697 B1 * | 5/2001 | Fang | H03L 7/14 331/25 |
| 11,038,666 B1 | 6/2021 | Duan et al. | |
| 2004/0141577 A1 | 7/2004 | Brunn et al. | |
| 2011/0029803 A1 | 2/2011 | Redman-White | |
| 2011/0037758 A1 | 2/2011 | Lim et al. | |
| 2021/0336760 A1 | 10/2021 | Duan et al. | |

FOREIGN PATENT DOCUMENTS

| | | |
|---|---|---|
| KR | 100357690 B1 | 10/2002 |
| KR | 20030012892 A | 2/2003 |
| KR | 20120131845 A | 12/2012 |
| KR | 20170008390 A | 1/2017 |
| KR | 20190098375 A | 8/2019 |
| WO | 2018034495 A1 | 2/2018 |

* cited by examiner

*Primary Examiner* — Cassandra F Cox
(74) *Attorney, Agent, or Firm* — CANTOR COLBURN LLP

(57) ABSTRACT

A signal receiving circuit includes first to third pulse generators; and a clock signal recovery unit 100 for generating a recovery clock signal RCLK and a recovery clock delay signal RCLKD, which is a signal obtained by delaying the recovery clock signal as much as a first delay time, using at least one of pulses including a first pulse, a second pulse, a third pulse, and first to third inversion pulses, wherein the clock signal recovery unit includes: a loop interruption circuit including an input node and an output node and turned on and off by at least one of the pulses; and a delay circuit having an input terminal connected to the output node and an output terminal connected to the input node. A signal value of the input node and a signal value of the output node are in an inverse relationship.

8 Claims, 10 Drawing Sheets

SIGNAL RECEIVING CIRCUIT, SIGNAL RECEIVING DEVICE, AND METHOD OF RECOVERING CLOCK OF RECEIVED SIGNAL

BACKGROUND OF THE INVENTION

Field of the Invention

An embodiment of the present invention relates to a signal receiving circuit, a signal receiving device, and a method of recovering a clock of a received signal.

Background of the Related Art

C-PHY is a high-speed communication standard proposed by the MIPI alliance. It uses three wires and a 3-phase signal to express six states, and encodes state transitions between consecutive states using symbols. The protocol enforces that there always is a state transition between consecutive symbols, and this feature allows embedding of clock information needed for recovery of symbols (data).

A C-PHY receiver is provided with a circuit that recovers clock signals on the basis of information embedded in a received signal. The clock recovery circuit should generate a clock signal corresponding to each symbol, and as the communication speed increases, the symbol interval decreases, and accordingly, a clock recovery circuit that may operate at a high speed is needed.

Previously proposed clock recovery methods include a full-rate clock recovery method and a half-rate clock recovery method.

The full-rate clock recovery method generates clock signals so that one rising edge corresponds to each received symbol (only the rising edges of the clock signal are used when symbols are recovered). At this point, since falling edges of a clock should exist between symbol clocks although the falling edges are not directly involved in symbol recovery, an additional time delay is needed to generate falling edges, and the maximum operating speed is limited as a result.

The half-rate clock recovery method generates clock signals so that one rising edge or one falling edge corresponds to each symbol. Since both the rising edge and the falling edge of a clock signal are used when symbols are recovered, the additional time delay is reduced, and this is advantageous for high-speed operation compared to the full-rate clock recovery method.

Patent Document 1 proposes a MIPI C-PHY receiving circuit applied with the full-rate clock recovery method. The full-rate clock recovery method has a limit in high-speed operation, and the half-rate clock recovery method introduced in Patent Document 2 and Patent Document 3 has been proposed to solve this problem.

However, according to the prior art, there is a limit in reducing the delay time that is inevitably involved in recovering a clock signal using an input signal, and as a result, there is a problem in that accuracy and efficiency of clock signal recovery are lowered when communication speed increases.

In addition, according to the prior art, there is a limit in reducing the area or power consumption of a circuit that performs a clock signal recovery function.

Accordingly, it is required to develop a technique capable of securing accuracy, miniaturization, low power consumption, and the like of clock signal recovery in a high-speed communication environment.

The background art described above is technical information that the inventor possesses to derive the present invention or has acquired in the process of deriving the present invention, and it cannot necessarily be said to be known technology disclosed to the general public before filing the application of the present invention.

(Patent Document 1) US 2021-0336760 A1 (2021 Oct. 28)
(Patent Document 2) U.S. Ser. No. 11/038,666 B1 (2021 Jun. 15)
(Patent Document 3) WO2018/034495 A1 (2018 Feb. 22)

SUMMARY OF THE INVENTION

In an aspect of the present invention, there is provided a signal receiving circuit capable of securing at least one among accuracy, miniaturization, and low power consumption of clock signal recovery in a high-speed communication environment.

To accomplish the above object, according to one aspect of the present invention, there is provided a signal receiving circuit that receives first to third input signals A, B, and C, each having a different signal level at each unit interval (UI), the circuit comprising: a first pulse generator for receiving a first differential signal RX_AB obtained by subtracting the second input signal B from the first input signal A, and generating a first pulse pulAB that is high (H) at an edge of the first differential signal RX_AB; a second pulse generator for receiving a second differential signal RX_BC obtained by subtracting the third input signal C from the second input signal B, and generating a second pulse pulBC that is high (H) at an edge of the second differential signal RX_BC; a third pulse generator for receiving a third differential signal RX_CA obtained by subtracting the first input signal A from the third input signal C, and generating a third pulse pulCA that is high (H) at an edge of the third differential signal RX_CA; and a clock signal recovery unit 100 for generating a recovery clock signal RCLK and a recovery clock delay signal RCLKD, which is a signal obtained by delaying the recovery clock signal as much as a first delay time, using at least one of pulses including the first pulse, the second pulse, the third pulse, a first inversion pulse pulbAB which is an inversion signal of the first pulse, a second inversion pulse pulbBC which is an inversion signal of the second pulse, and a third inversion pulse pulbCA, which is an inversion signal of the third pulse, wherein the clock signal recovery unit includes: a loop interruption circuit 110 including an input node 111 and an output node 112 and turned on and off by at least one of the pulses; and a delay circuit 120 having an input terminal connected to the output node 112 and an output terminal connected to the input node 111, wherein a signal value of the input node and a signal value of the output node are in an inverse relationship.

At this point, the loop interruption circuit may include: a first PMOS transistor MP1 having a gate connected to the input node and one end connected to the output node; a first NMOS transistor MN1 having a gate connected to the input node and one end connected to the output node; a second PMOS transistor, a third PMOS transistor, and a fourth PMOS transistor, each having one end connected to the other end of the first PMOS transistor, and a gate to which the first inversion pulse, the second inversion pulse, or the third inversion pulse is applied; and a second NMOS transistor, a third NMOS transistor, and a fourth NMOS transistor, each having one end connected to the other end of the first NMOS transistor, and a gate to which the first pulse, the second pulse, or the third pulse is applied.

In addition, the loop interruption circuit may include: first to third NMOS transistors, each having one end connected to the input node, and the other end connected to the output node; and first to third PMOS transistors, each having one end connected to the input node, and the other end connected to the output node, wherein the first pulse may be applied to the gate of the first NMOS transistor, the second pulse may be applied to the gate of the second NMOS transistor, the third pulse may be applied to the gate of the third NMOS transistor, the first inversion pulse may be applied to the gate of the first PMOS transistor, the second inversion pulse may be applied to the gate of the second PMOS transistor, and the third inversion pulse may be applied to the gate of the third PMOS transistor.

In addition, the clock signal recovery unit may further include a keeper 130 connected to the output node to prevent shaking of a signal output to the output node.

In addition, the loop interruption circuit may further include a plurality of transistors, wherein when the pulses are applied to the transistors, the transistors begin to operate after an injection delay elapses, and the first delay time may be larger than the timing skew of the edges of the first to third differential signals and smaller than a value obtained by subtracting the injection delay from the unit interval.

A method of recovering a clock of a received signal according to an embodiment of the present invention comprises: a step of receiving first to third input signals, each having a different signal level at each unit interval; a step of generating a first differential signal that is a differential signal of the first input signal and the second input signal, a second differential signal that is a differential signal of the second input signal and the third input signal, and a third differential signal that is a differential signal of the third input signal and the first input signal; and a clock signal recovery step of recovering the clock signal using at least one of pulses, including first to third pulses that are high (H) at an edge of each of the first to third differential signals, and first to third inversion pulses that are inversion signals of the first to third pulses, wherein the clock signal recovery step is performed by a clock signal recovery unit including a loop configured of a loop interruption circuit and a delay circuit, and includes the steps of: generating the recovery clock signal as the loop interruption circuit is turned on when one of the first to third pulses becomes high (H); generating, by the delay circuit, a recovery clock delay signal obtained by delaying the recovery clock signal as much as a first delay time; and inputting the recovery clock delay signal into the input node of the loop interruption circuit, wherein a signal value of the input node and a signal value of the output node are in an inverse relationship.

At this point, the clock signal recovery step may include the steps of outputting a high signal to the output node of the loop interruption circuit when one of the first to third pulses becomes high (H), outputting a high signal to the output node of the loop interruption circuit when one of the first to third pulses becomes high (H) before the first delay time elapses, and outputting a low signal to the output node of the loop interruption circuit when one of the first to third pulses becomes high (H) after the first delay time elapses.

A signal receiving device according to an embodiment of the present invention includes: first to N-th clock recovery modules 1200 operating in a half-rate clock recovery method; and a logic operation unit for performing logic operation on the recovery clock signal output from the first to N-th clock recovery modules and outputting the recovery clock signal, wherein the first to N-th clock recovery modules generate a recovery clock delay signal obtained by delaying the recovery clock signal as much as a second delay time, wherein the second delay time is larger than the unit interval, and the first to N-th clock recovery modules are sequentially enabled at each unit interval.

DETAILED DESCRIPTION OF THE PREFERRED EMBODIMENT

Figure 1:
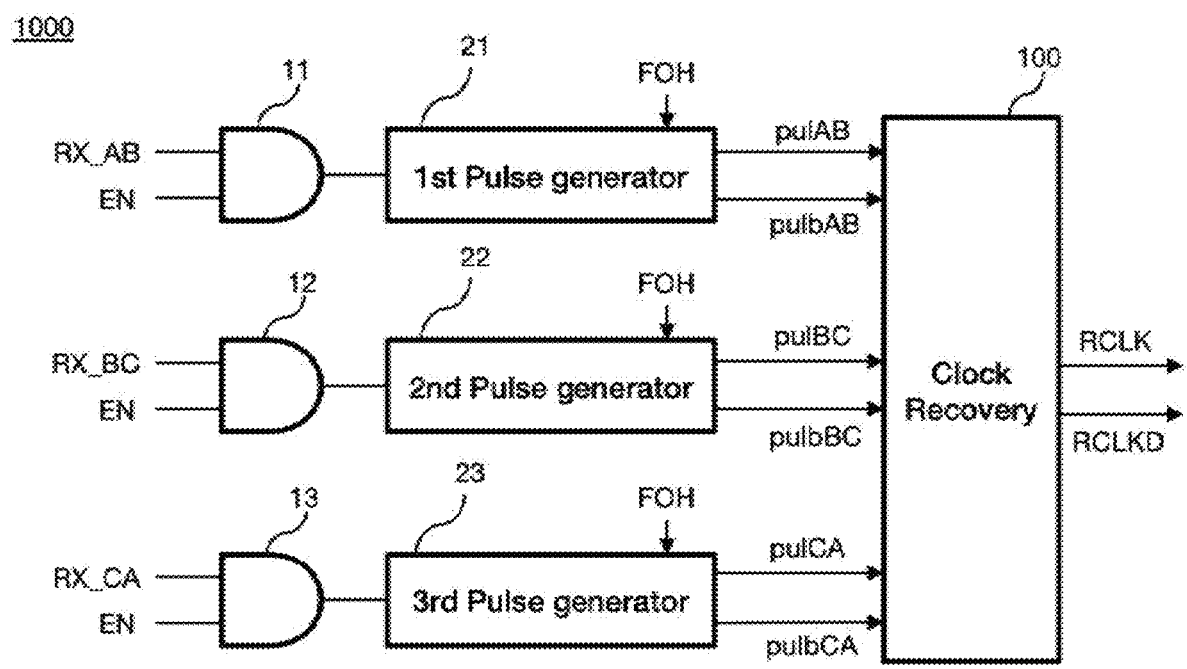
FIG. 1 is a diagram schematically illustrating a signal receiving circuit according to an embodiment of the present invention.

The advantages and features of the present invention and methods for achieving the same will become clear by referring to the embodiments described below in detail together with the accompanying drawings. However, the present invention is not limited to the embodiments disclosed below and may be implemented in various different forms. These embodiments are provided to make the disclosure of the present invention complete and fully convey the scope of the present invention to those skilled in the art. Like reference numerals refer to like elements throughout the specification.

The terms used in this specification are for describing the embodiments and are not intended to limit the present invention. In this specification, singular forms also include plural forms unless specifically stated otherwise in the context. Terms such as 'comprise' and/or 'comprising' used in the specification mean that the mentioned components, steps, operations, and/or elements do not exclude the presence or addition of one or more other components, steps, operations, and/or elements.

Hereinafter, the configuration and effects of the present invention will be described in more detail with reference to the accompanying drawings.

Figure 2:
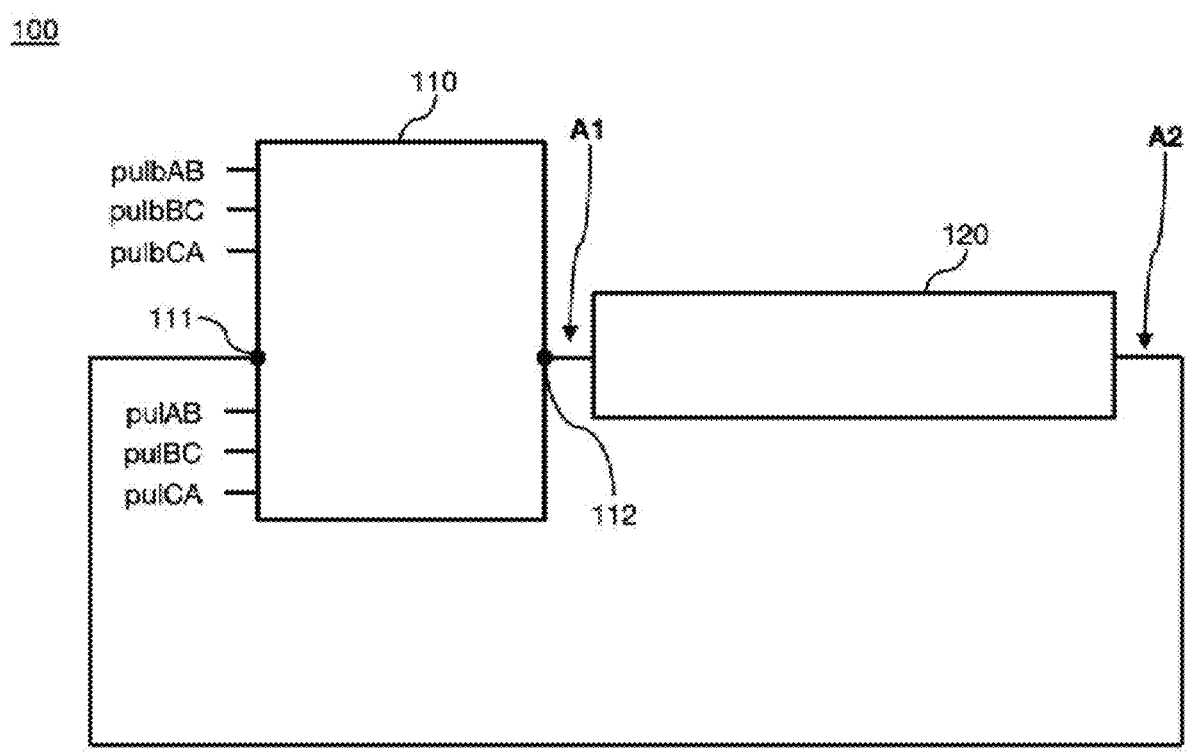
FIG. 2 is a diagram schematically illustrating a clock signal recovery unit according to an embodiment of the present invention.
Figure 3:
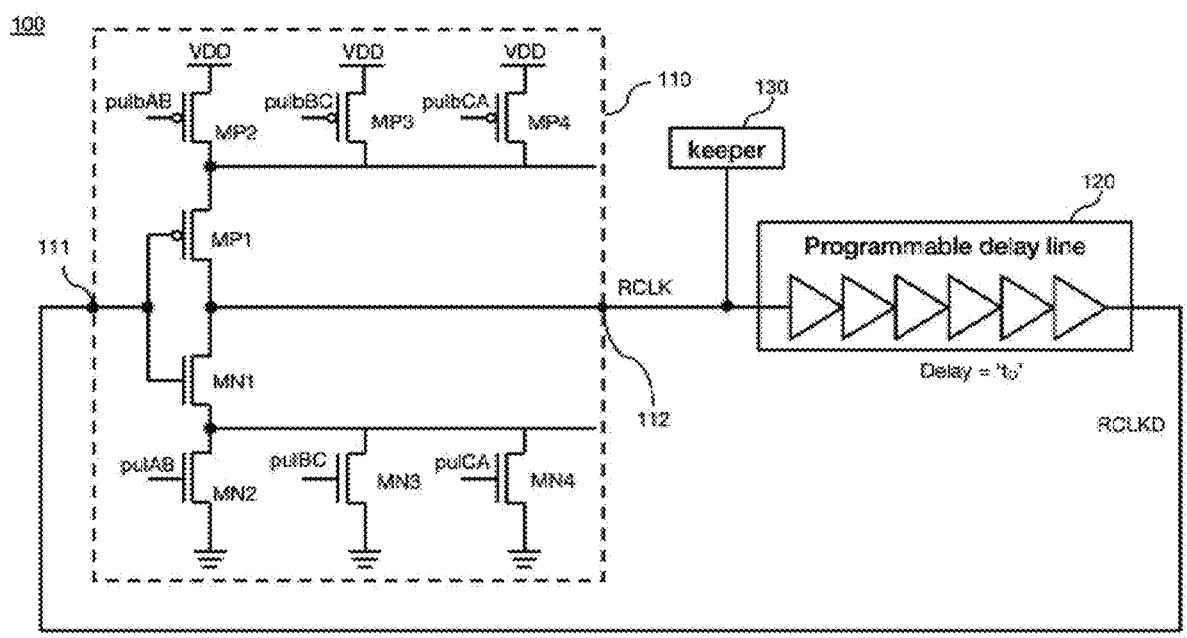
FIG. 3 is a diagram illustrating in detail a clock signal recovery unit according to an embodiment of the present invention.
Figure 4:
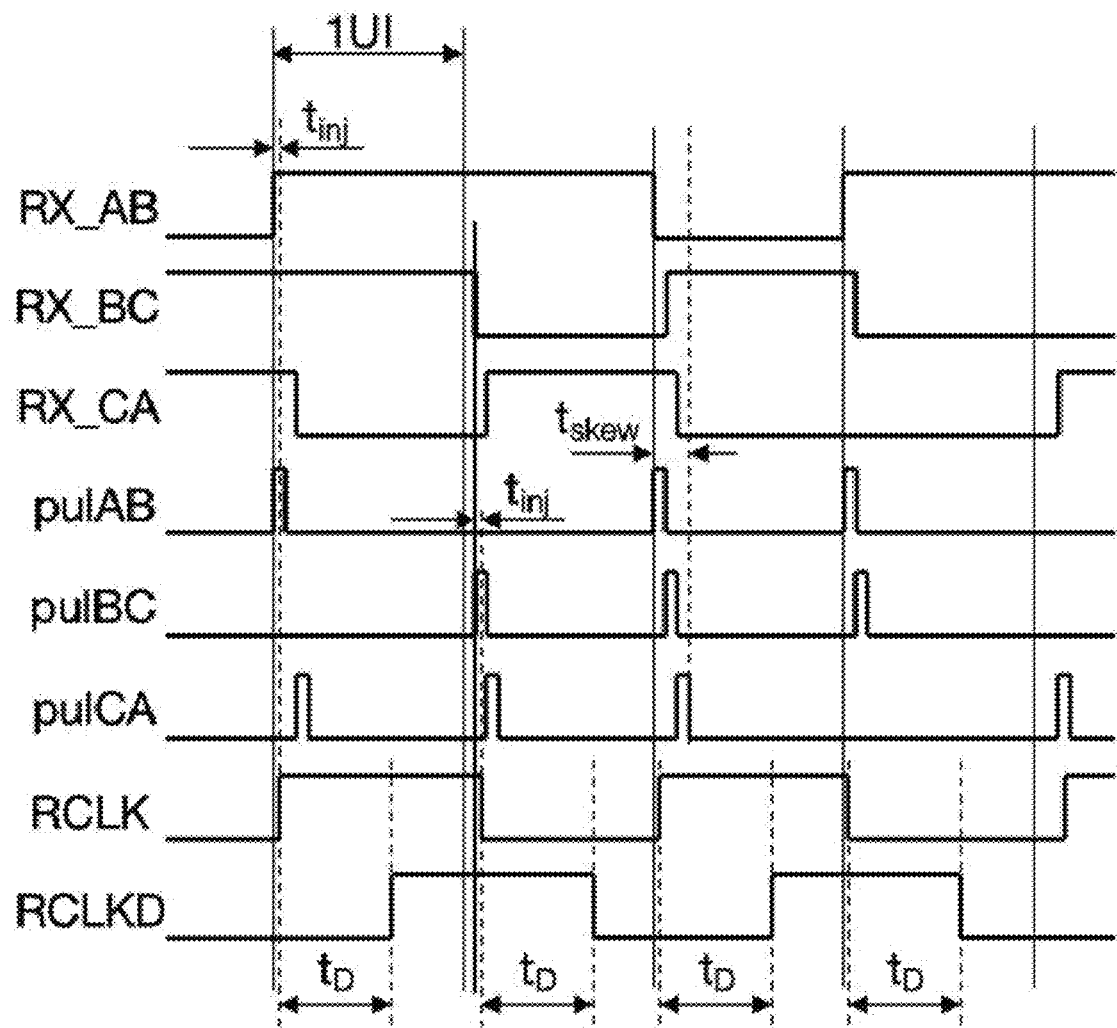
FIG. 4 is a diagram schematically illustrating a signal timing diagram of a signal receiving circuit according to an embodiment of the present invention.
Figure 5:
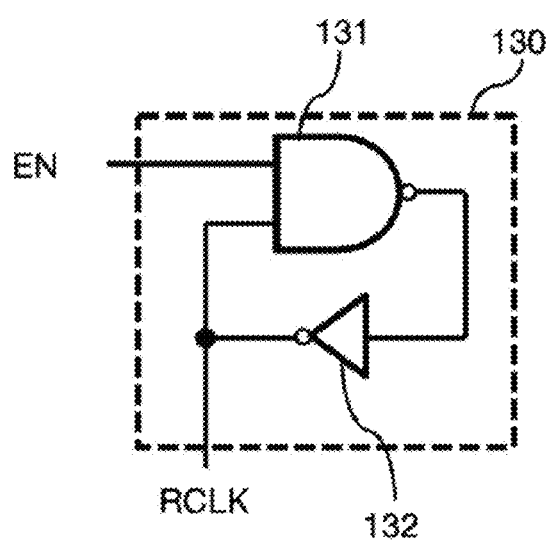
FIG. 5 is a diagram illustrating in detail a keeper according to an embodiment of the present invention.
Figure 6:
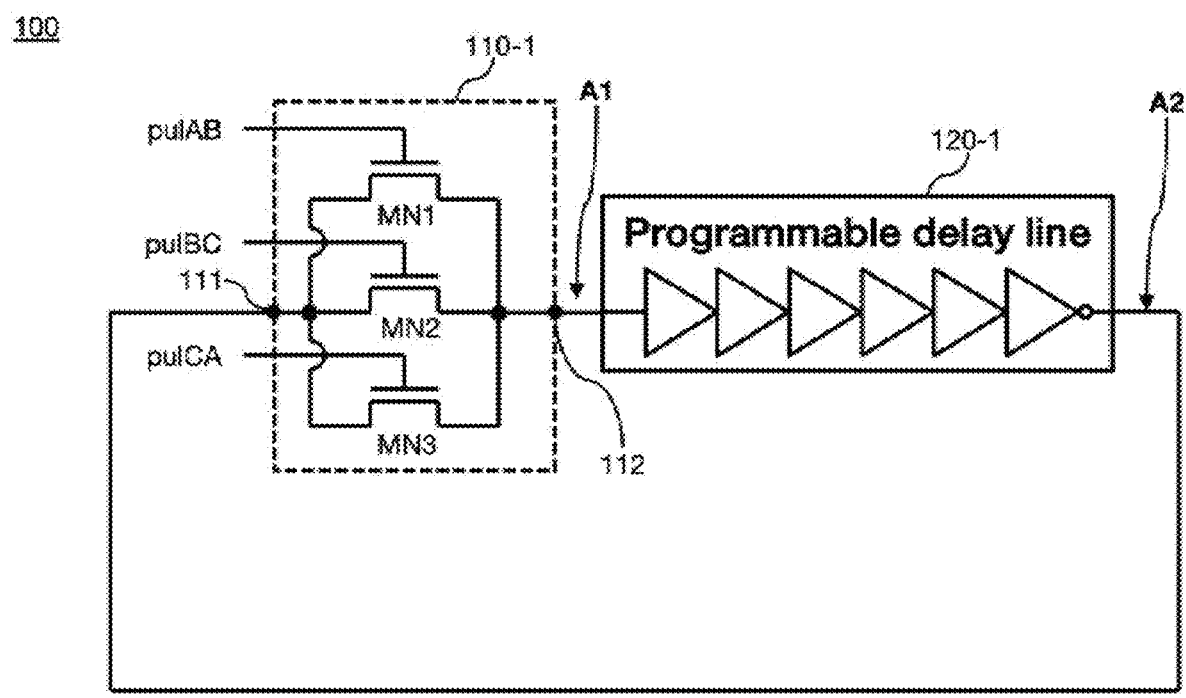
FIG. 6 is a diagram illustrating in detail a clock signal recovery unit according to another embodiment of the present invention.
Figure 7:
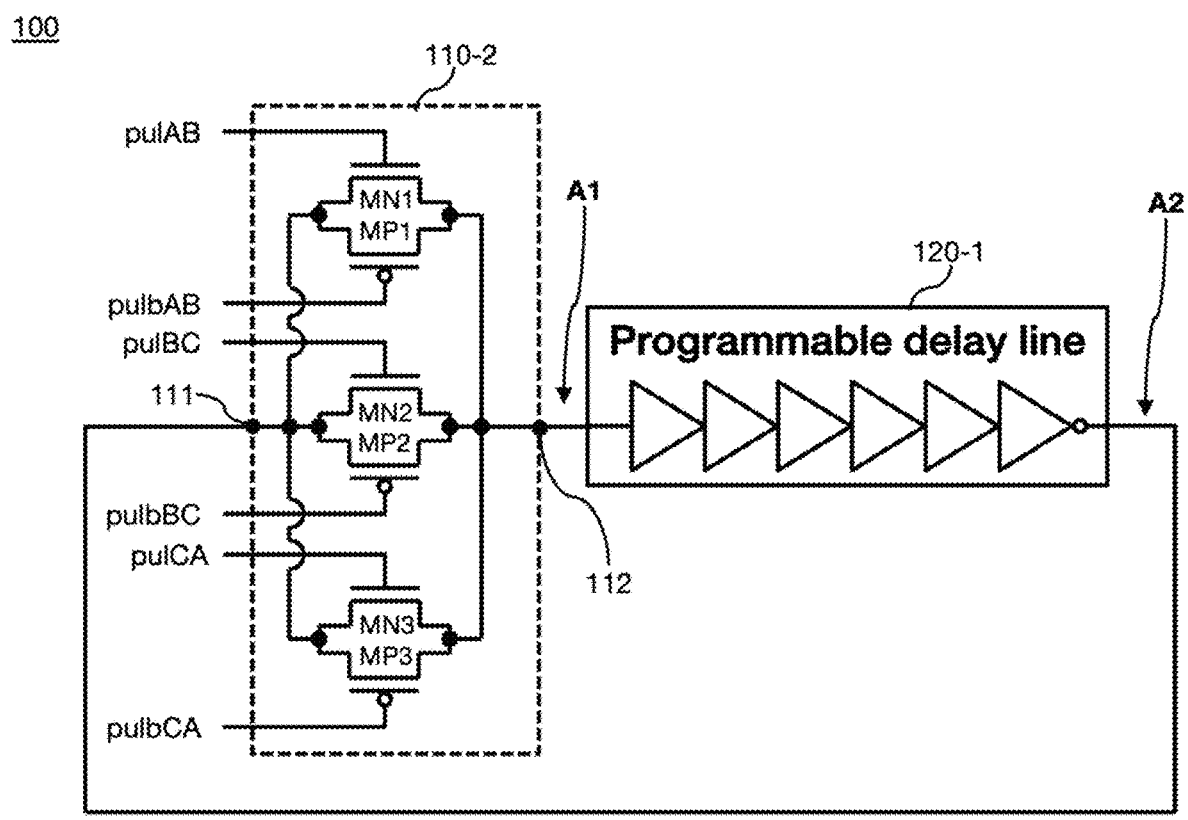
FIG. 7 is a diagram illustrating in detail a clock signal recovery unit according to still another embodiment of the present invention.
Figure 8:
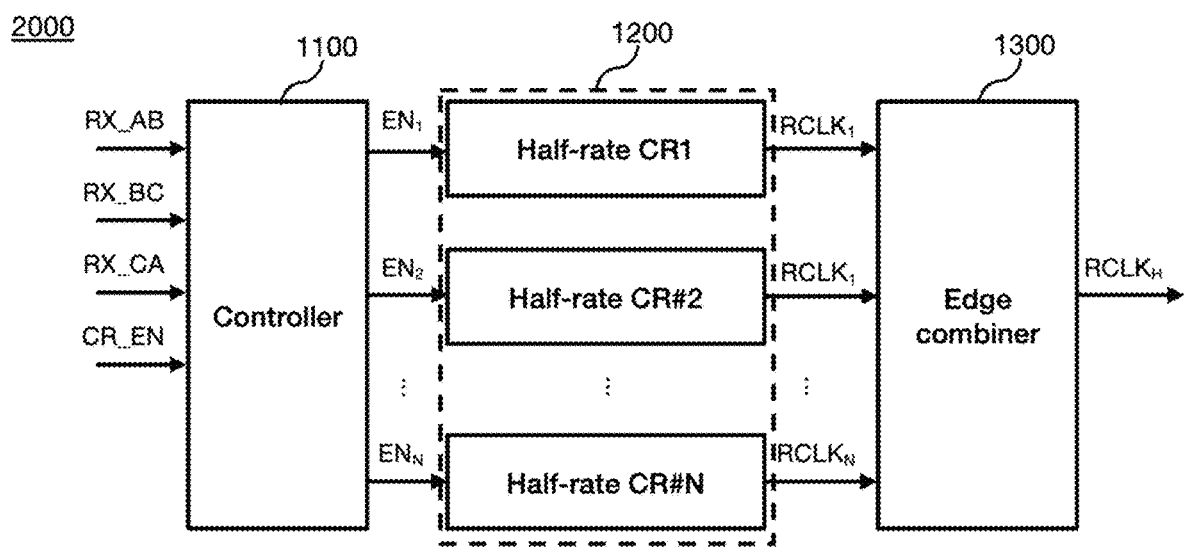
FIG. 8 is a diagram schematically illustrating a signal receiving device according to an embodiment of the present invention.
Figure 9:
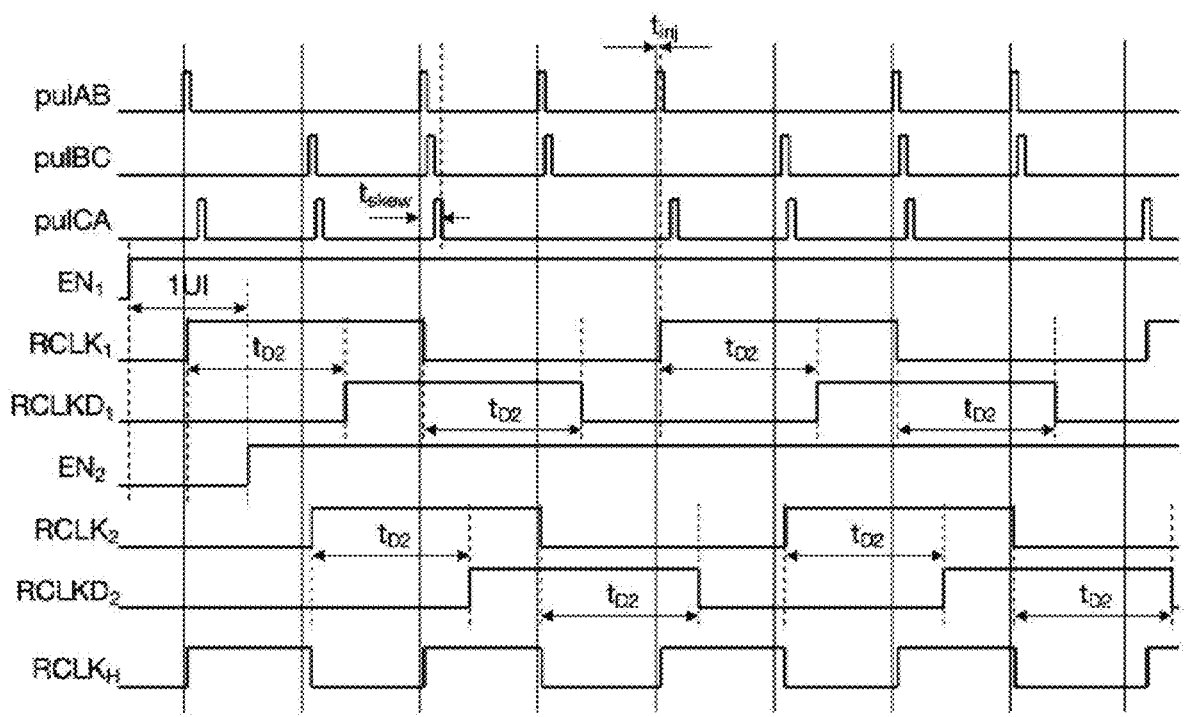
FIG. 9 is a diagram schematically illustrating a signal timing diagram of a signal receiving device according to an embodiment of the present invention.
Figure 10:
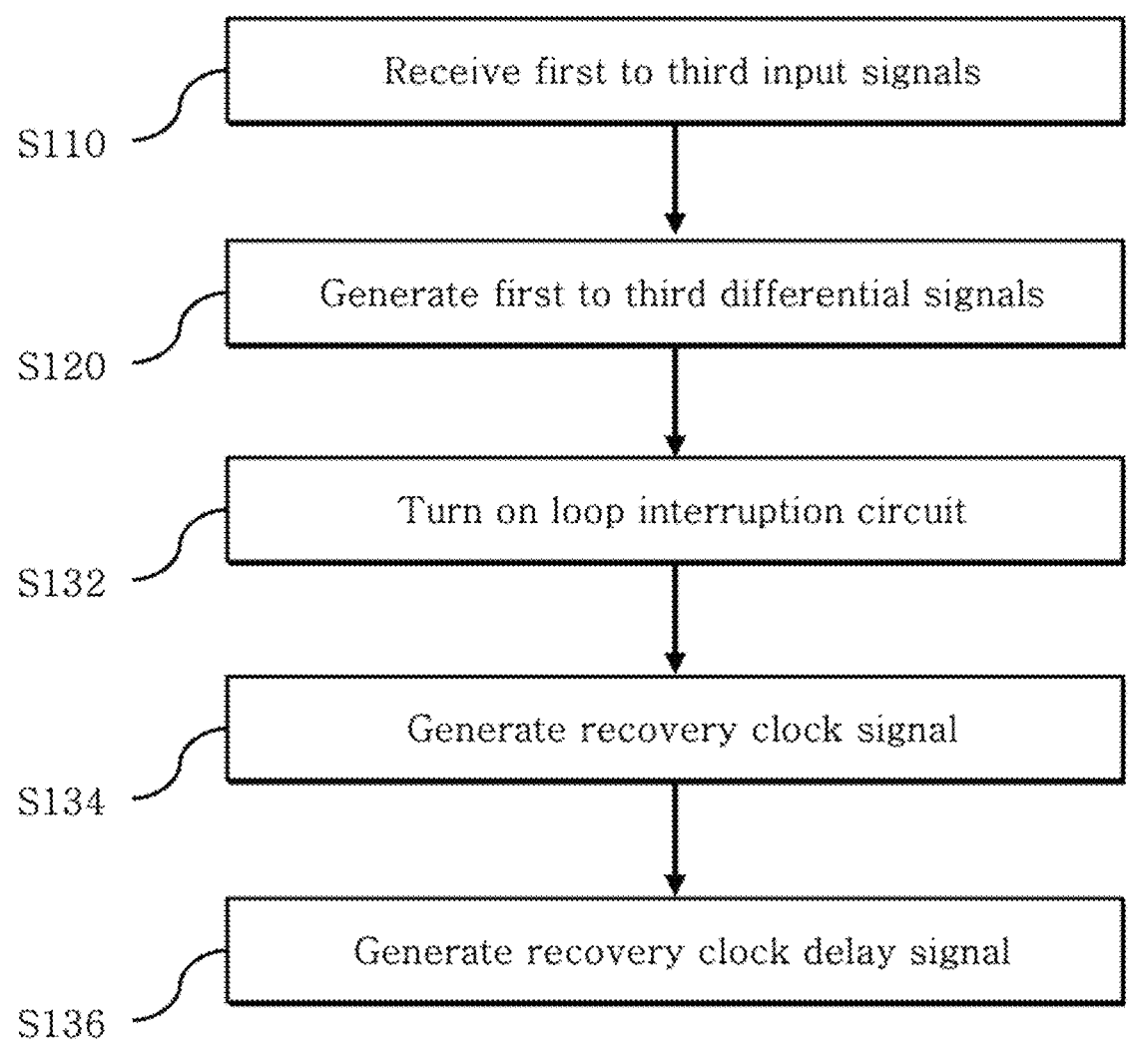
FIG. 10 is a diagram schematically illustrating a method of recovering a clock of a received signal according to an embodiment of the present invention.

FIG. 1 is a diagram schematically illustrating a signal receiving circuit according to an embodiment of the present invention, FIG. 2 is a diagram schematically illustrating a clock signal recovery unit according to an embodiment of the present invention, FIG. 3 is a diagram illustrating in detail a clock signal recovery unit 100 according to an embodiment of the present invention, FIG. 4 is a diagram schematically illustrating a signal timing diagram of a signal receiving circuit 1000 according to an embodiment of the present invention, FIG. 5 is a diagram illustrating in detail a keeper according to an embodiment of the present invention, FIG. 6 is a diagram illustrating in detail a clock signal recovery unit 100 according to another embodiment of the present invention, FIG. 7 is a diagram illustrating in detail a clock signal recovery unit 100 according to still another embodiment of the present invention, FIG. 8 is a diagram schematically illustrating a signal receiving device 2000 according to an embodiment of the present invention, FIG. 9 is a diagram schematically illustrating a signal timing diagram of a signal receiving device 2000 according to an embodiment of the present invention, and FIG. 10 is a diagram schematically illustrating a method of recovering a clock of a received signal according to an embodiment of the present invention.

The present invention relates to a signal receiving circuit 1000.

The signal receiving circuit 1000 according to an embodiment of the present invention may satisfy the C-PHY specification of Mobile Industry Process Interface (MIPI), but it is not limited thereto.

The signal receiving circuit 1000 according to an embodiment of the present invention may include a clock signal recovery unit 100. In an embodiment, the clock signal recovery unit 100 may operate in a half-rate clock recovery method.

In an embodiment, the signal receiving circuit 1000 may receive first to third input signals A, B, and C having a different signal level and recover a clock signal at each unit interval (UI).

In an embodiment, the clock signal recovery unit 100 generates a recovery clock signal RCLK using at least one of pulses. In an embodiment, the clock signal recovery unit 100 may generate a recovery clock delay signal RCLKD.

In an embodiment, a pulse generator may generate pulses. At this point, the pulses may include a first pulse pulAB, a second pulse pulBC, a third pulse pulCA, a first inversion pulse pulbAB, which is an inversion signal of the first pulse pulAB, a second inversion pulse pulbBC, which is an inversion signal of the second pulse pulBC, and a third inversion pulse pulbCA, which is an inversion signal of the third pulse pulCA.

For example, a first pulse generator 21 may receive a first differential signal RX_AB obtained by subtracting the second input signal B from the first input signal A, and generate a first pulse pulAB that is high (H) at the edge of the first differential signal RX_AB.

In addition, the second pulse generator 22 may receive a second differential signal RX_BC obtained by subtracting the third input signal C from the second input signal B, and generate a second pulse pulBC that is high (H) at the edge of the second differential signal RX_BC.

In addition, the third pulse generator 23 may receive a third differential signal RX_CA obtained by subtracting the first input signal A from the third input signal C, and generate a third pulse pulCA that is high (H) at the edge of the third differential signal RX_CA.

Referring to FIG. 1, when a control signal of pulse generator FOH is high (H), all the first to third pulses pulAB, pulBC, and pulCA may be high (H). In an embodiment, when the FOH is high (H), the recovery clock signal RCLK generated by the clock signal recovery unit is unrelated to the first to third input signals A, B, and C, and the frequency is determined by a first delay time $t_D$. Observing the frequency of the recovery clock signal RCLK considering these characteristics while changing the control signal of the delay circuit 120 implemented as a programmable delay line in a state that the FOH is high (H), the relationship between the control signal and the first delay time $t_D$ can be grasped. Since a value of the first delay time $t_D$, which is required when clock recovery from the received signal is actually performed, is determined by the operating frequency of the first to third input signals A, B, and C and the size of timing skew $t_{skew}$, a control signal to be applied to the programmable delay line may be determined using the relationship described above. That is, the control signal or the like of the programmable delay line may be adaptively controlled or calibrated using the FOH.

Referring to FIG. 1, the first to third differential signals RX_AB, RX_BC, and RX_CA may be input into first to third AND gates 11, 12, and 13, AND-operated with the enable signal EN, and provided to the first to third pulse generators 21, 22, and 23, respectively.

Meanwhile, the first to third inversion pulses pulbAB, pulbBC, and pulbCA do not necessarily need to be generated by the pulse generators. That is, the first to third inversion pulses pulbAB, pulbBC, and pulbCA may be generated in a method of providing an inverter or the like between the pulse generator and the clock signal recovery unit 100 or inside the clock signal recovery unit 100.

In an embodiment, the clock signal recovery unit 100 may include a loop interruption circuit 110 and a delay circuit 120. The loop interruption circuit 110 includes an input node 111 and an output node 112. In addition, the loop interruption circuit 110 may connect or disconnect the input node 111 and the output node 112 by at least one of the pulses described above.

In an embodiment, the input terminal of the delay circuit 120 is connected to the output node 112 of the loop interruption circuit 110, and the output terminal of the delay circuit 120 is connected to the input node 111 of the loop interruption circuit 110. Then, the delay circuit 120 outputs the input signal delayed as much as a predetermined first delay time $t_D$.

The signal output through the output node 112 of the loop interruption circuit 110 is delayed by the delay circuit 120 as much as the first delay time $t_D$ and applied to the input node 111 of the loop interruption circuit 110.

The signal receiving circuit 1000 according to an embodiment of the present invention enables that the signal value of the input node 111 and the signal value of the output node 112 are in an inverted relationship. In an embodiment, an inverter may be provided between the output node 112 and the delay circuit 120 (A1) or between the delay circuit 120 and the input node 111 (A2) to invert the signal value. In another embodiment, signal delay and signal inversion may be performed by the delay circuit 120 itself (an inverter is provided in the delay circuit 120 as shown in FIGS. 6 and 7). In another embodiment, the loop interruption circuit 110 itself may invert the signal value of the input node 111 and output an inverted signal value to the output node 112 (see the embodiment shown in FIG. 3).

In an embodiment, when at least one of the first to third pulses pulAB, pulBC, and pulCA becomes high (H), the input node 111 and the output node 112 are connected, and the signal value of the input node 111 may be transferred to the output node 112. In addition, even when another one of the first to third pulses pulAB, pulBC, and pulCA becomes high (H) before the first delay time $t_D$ delayed by the delay circuit 120 elapses, the signal value of the output node 112 is maintained. Then, when another one of the first to third pulses pulAB, pulBC, and pulCA becomes high (H) after the first delay time $t_D$ elapses, the signal value of the output node 112 is inverted. In this way, the recovery clock signal RCLK may be generated by the clock signal recovery unit 100. Here, the signal obtained by delaying the recovery clock signal RCLK as much as the first delay time $t_D$ may be referred to as the recovery clock delay signal RCLKD. The signal receiving circuit 1000 according to an embodiment of the present invention may recover data to be transmitted through the first to third signals A, B, and C by utilizing at least one among the recovery clock signal RCLK and the recovery clock delay signal RCLKD generated by the clock signal recovery unit 100. To this end, a data recovery unit (not shown) may be included in the signal receiving circuit 1000.

Although a method of recovering a clock signal using the first to third pulses pulAB, pulBC, and pulCA is described in the embodiment described above, the first to third inversion pulses pulbAB, pulbBC, and pulbCA may be used or both the first to third pulses pulAB, pulBC, and pulCA and the first to third inversion pulses pulbAB, pulbBC, and pulbCA may be used to recover the clock signal.

In an embodiment, the loop interruption circuit 110 may be implemented as a tri-state inverter. At this point, the tri-state inverter may take three states of high (H), low (L), and high-impedance (Hi-Z), and the high-impedance (Hi-Z) state means a state in a section where the tri-state inverter is deactivated. Here, when the first to third pulses pulAB, pulBC, and pulCA are low (L), the tri-state inverter is deactivated.

Referring to FIG. 3, the loop interruption circuit 110 may include first to fourth PMOS transistors and first to fourth NMOS transistors. The gate of the first PMOS transistor MP1 is connected to the input node 111, and one end is connected to the output node 112. The gate of the first NMOS transistor MN1 is connected to the input node 111, and one end is connected to the output node 112. Each of the second to fourth PMOS transistors MP2, MP3, MP4 has one end connected to the other end of the first PMOS transistor MP1, and the first inversion pulse pulbAB, the second inversion pulse pulbBC, and the third inversion pulse pulbCA are applied to the gates of the second to fourth PMOS transistors, respectively. Each of the second to fourth NMOS transistors MN2, MN3, MN4 has one end connected to the other end of the first NMOS transistor MN1, and the first pulse pulAB, the second pulse pulBC, and the third pulse pulCA are applied to the gates of the second to fourth NMOS transistors, respectively.

Referring to FIGS. 3 and 4, when the first pulse pulAB becomes high (H) at the rising edge of the first differential signal RX_AB in a state that the input node 111 is low (L), and the high (H) signal value of the first pulse pulAB is applied to the loop interruption circuit 110, the low (L) signal value of the input node 111 is inverted and output to the output node 112 as the first to fourth PMOS transistors and the first to fourth NMOS transistors begin to operate, and the signal value of the output node 112 changes from low (L) to high (H). Meanwhile, the signal output to the output node 112 may be referred to as a recovery clock signal RCLK.

In an embodiment, the delay circuit 120 outputs a recovery clock delay signal RCLKD obtained by delaying the recovery clock signal RCLK as much as a first delay time $t_D$, and the recovery clock delay signal RCLKD is applied to the input node 111.

Next, the third pulse pulCA becomes high (H) at the rising edge of the third differential signal RX_CA, and when the high signal value of the third pulse pulCA is applied to the loop interruption circuit 110, the first to fourth PMOS transistors and the first to fourth NMOS transistors begin to operate.

At this point, since it is in a state of applying the recovery clock delay signal RCLKD to the input node 111, the low (L) signal value of the recovery clock delay signal RCLKD is inverted and output to the output node 112, and the signal value of the output node 112 maintains high (H).

Next, when the first delay time $t_D$ elapses, the recovery delay clock signal becomes high (H), and at the same time, the signal value of the input node 111 becomes high (H).

Next, when the second pulse pulBC becomes high (H) at the falling edge of the second differential signal (RX_BC), and the high signal value of the third pulse pulCA is applied to the loop interruption circuit 110, the high (H) signal value of the input node 111 is inverted and output to the output node 112 as the first to fourth PMOS transistors and the first to fourth NMOS transistors begin to operate, and the signal value of the output node 112 changes from high (H) to low (L).

Referring to FIG. 3, the clock signal recovery unit 100 may further include a keeper 130. In an embodiment, the keeper 130 is connected to the output node 112 and may perform a function of preventing shaking of the signal output to the output node 112.

Referring to FIG. 5, in an embodiment, the keeper 130 may include a NAND gate 131 and an inverter 132. At this point, the output node 112 may be connected to the first input terminal of the NAND gate 131, and a control signal may be applied to the second input terminal of the NAND gate 131. In addition, the input terminal of the inverter 132 may be connected to the output terminal of the NAND gate 131, and the output terminal of the inverter 132 may be connected to the output node 112.

In FIG. 4, $t_{inj}$ may mean a delay time according to a time required for the transistors to react when the first to third pulses pulAB, pulBC, and pulCA and the first to third inversion pulses pulbAB, pulbBC, and pulbCA are applied to the loop interruption circuit 110, and may be referred to as injection delay.

In addition, $t_{skew}$ may mean a timing skew $t_{skew}$ in which the timing of the edges of the first to third differential signals RX_AB, RX_BC, and RX_CA do not match within a unit interval (UI).

The skew problem may be solved when the recovery clock signal RCLK is not affected although the second pulse pulBC or the third pulse pulCA becomes high (H) within the period of timing skew $t_{skew}$ after the first pulse pulAB becomes high (H). To this end, a recovery clock signal RCLK, which becomes high (H) to correspond to the edge of the differential signal generated first within the unit interval (UI), is generated, and the recovery clock signal RCLK is maintained although the edge of the differential signal occurs again within the first delay time $t_D$. At this point, the first delay time $t_D$ may be set to be larger than the timing skew $t_{skew}$ of the edges of the first to third differential signals RX_AB, RX_BC, and RX_CA and smaller than a value obtained by subtracting the injection delay $t_{inj}$ from the unit interval (UI). Here, the first delay time $t_D$ may be determined by the delay circuit 120, and in an embodiment, when the delay circuit 120 is implemented as a programmable delay line, the first delay time $t_D$ may also be adjusted.

As the first delay time $t_D$ is set to be larger than the timing skew $t_{skew}$ and smaller than a value obtained by subtracting the injection delay $t_{inj}$ from the unit interval (UI), the signal receiving circuit 1000 according to an embodiment of the present invention may recover the clock signal in the half-rate clock recovery method.

In the prior art, it is difficult to set the delay time as the unit interval (UI) decreases since there is a large delay time inevitably involved in the circuit design, in addition to the intentionally adjusted delay time. However, in the signal receiving circuit 1000 according to an embodiment of the present invention, since the only delay time that inevitably occurs for clock recovery is the injection delay $t_{inj}$ described above, a sufficient margin can be secured in setting the first delay time $t_D$. That is, when the unit interval (UI) decreases as the communication speed increases and thus the difference between the timing skew $t_{skew}$ and the unit interval (UI) is reduced, the present invention is advantageous in improving accuracy of clock recovery compared to other conventional techniques.

In addition, although conventional circuits occupy a considerable area on the circuit or consume considerable power to recover the clock signal in many cases, since the signal receiving circuit 1000 according to an embodiment of the present invention may recover the clock signal only with the loop interruption circuit 110 and the delay circuit 120 configured of transistors, accuracy and efficiency of clock signal recovery can be improved, and it is advantageous in reducing the area and power consumption.

Referring to FIG. 6, the loop interruption circuit 110 may be implemented using first to third NMOS transistors. At this point, one end of the first to third NMOS transistors is connected to the input node 111, and the other end is connected to the output node 112. In addition, the first pulse pulAB is applied to the gate of the first NMOS transistor MN1, the second pulse pulBC is applied to the gate of the second NMOS transistor MN2, and the third pulse pulCA is applied to the gate of the third NMOS transistor MN3.

Accordingly, when any one of the pulses becomes high (H), the signal value of the input node 111 is output to the output node 112. In addition, the output signal is delayed by the delay circuit 120 as much as the first delay time $t_D$ and applied to the input node 111.

Referring to FIG. 7, the loop interruption circuit 110 may be implemented using first to third NMOS transistors and first to third PMOS transistors. At this point, one end of the first to third NMOS transistors and the first to third PMOS transistors is connected to the input node 111, and the other end is connected to the output node 112. In addition, the first pulse pulAB is applied to the gate of the first NMOS transistor MN1, the second pulse pulBC is applied to the gate of the second NMOS transistor MN2, the third pulse pulCA is applied to the gate of the third NMOS transistor MN3, the first inversion pulse pulbAB is applied to the gate of the first PMOS transistor MP1, the second inversion pulse pulbBC is applied to the gate of the second PMOS transistor MP2, and the third inversion pulse pulbCA is applied to the gate of the third PMOS transistor MP3.

Accordingly, when any one of the pulses becomes high (H), the signal value of the input node 111 is output to the output node 112. In addition, the output signal is delayed by the delay circuit 120 as much as the first delay time $t_D$ and applied to the input node 111. Here, signal delay and signal inversion may be performed by the delay circuit 120 itself. An inverter (not shown) may be provided between the output node 112 and the delay circuit 120 (A1) or between the delay circuit 120 and the input node 111 (A2).

Referring to FIGS. 8 and 9, the signal receiving device 2000 according to an embodiment of the present invention is a signal receiving device 2000 that receives first to third input signals A, B, and C, each having a different signal level at each unit interval (UI).

In an embodiment, the signal receiving device 2000 may include first to N-th clock recovery modules 1200 and a logic operation unit 1300.

Each of the first to N-th clock recovery modules 1200 operates in a half-rate clock recovery method, and generates a recovery clock signal and a recovery clock delay signal (a signal obtained by delaying the recovery clock signal as much as a second delay time $t_{D2}$).

The logic operation unit 1300 performs logic operation on the recovery clock signal output from the first to N-th clock recovery modules 1200 and outputs the signal. At this point, the logic operation may include an XOR operation or the like, and may be implemented as an edge combiner 1300 or the like.

At this point, the second delay time $t_{D2}$ is larger than the unit interval (UI), and the first to N-th clock recovery modules 1200 are sequentially enabled at each unit interval (UI).

In an embodiment, when a sum of the injection delay $t_{inj}$ and the second delay time $t_{D2}$ is smaller than N times of the unit interval (UI), and the second delay time $t_{D2}$ is larger than a value obtained by adding the timing skew $t_{skew}$ to N−1 times of the unit interval (UI), N ½N-rate clock signals are generated, and these values may be used as a reference clock for data recovery by performing logic operation thereon. Accordingly, even when the communication speed increases and thus the unit interval (UI) becomes shorter than a delay time that can be designed, the clock signal may be recovered using the ½N-rate clock recovery method.

In an embodiment, the signal receiving device 2000 may further include a control unit 1100. The control unit 1100 may receive first to third differential signals RX_AB, RX_BC, and RX_CA and provide first to N-th enable signals (EN1, EN2, . . . ENN) to the first to N-th clock recovery modules 1200.

For example, a case where N is 2 is described below.

A first clock recovery module may be activated and generate a first recovery clock signal $RCLK_1$ and a first recovery clock delay signal $RCLKD_1$.

Next, a second recovery clock signal $RCLK_2$ and a second recovery clock delay signal $RCLKD_2$ may be generated as a second clock recovery module is activated when one unit interval (UI) elapses from the time point at which the first clock recovery module is activated.

Next, the logic operation unit 1300 may generate a recovery clock signal RCLKH by performing an XOR operation on the first recovery clock signal $RCLK_1$ and the second recovery clock signal $RCLK_2$.

The clock signal recovery method according to an embodiment of the present invention includes the steps of receiving first to third input signals A, B, and C (S110); generating first to third differential signals RX_AB, RX_BC, and RX_CA (S120); and recovering the clock signal.

The first to third input signals have a different signal level at each unit interval (UI).

Pulses may be generated using the first to third differential signals RX_AB, RX_BC, and RX_CA. At this point, the pulses may include first to third pulses pulAB, pulBC, and pulCA, and first to third inversion pulses pulbAB, pulbBC, and pulbCA.

At the clock signal recovery step, the clock signal is recovered using at least one of the pulses.

The clock signal recovery step may be performed by the clock signal recovery unit 100 including a loop configured of a loop interruption circuit 110 and a delay circuit 120.

First, when one of the first to third pulses pulAB, pulBC, and pulCA becomes high (H), the loop interruption circuit 110 is turned on (S132), and a recovery clock signal RCLK is generated (S134).

Next, the delay circuit 120 generates a recovery clock delay signal RCLKD obtained by delaying the recovery clock signal RCLK as much as a first delay time $t_D$(S136). This recovery clock delay signal RCLKD is input into the input node 111 of the loop interruption circuit 110. At this point, the signal value of the input node 111 and the signal value of the output node 112 are in an inverted relationship.

In an embodiment, when one of the first to third pulses pulAB, pulBC, and pulCA becomes high (H), a high signal is output to the output node 112 of the loop interruption circuit 110.

At this point, when one of the first to third pulses pulAB, pulBC, and pulCA becomes high (H) before the first delay time $t_D$ elapses, a high signal is output to the output node 112 of the loop interruption circuit 110.

In addition, when one of the first to third pulses pulAB, pulBC, and pulCA becomes high (H) after the first delay time $t_D$ elapses, a low signal is output to the output node 112 of the loop interruption circuit 110.

In an embodiment, when one of the first to third pulses pulAB, pulBC, and pulCA becomes high while a high (H) signal is applied to the input node 111, the high (H) signal applied to the input node 111 of the loop interruption circuit 110 is inverted, and a low (L) signal is output to the output node 112 of the loop interruption circuit 110.

In this specification, all of the differential signals, pulses, inversion pulses, recovery clock signals, recovery clock delay signals, and the like may mean digital signals.

In this specification, the types and timing diagrams of transistors to which pulses are applied are described on the basis of a case of generating a high pulse at the edge of a differential signal. However, it will be easy for those skilled in the art to understand that it may be replaced accordingly on the basis of a case of generating a low pulse at the edge of the differential signal.

Although the present invention has been described with reference to the embodiments illustrated in the accompanying drawings, this is only illustrative, and those skilled in the art will understand that various modifications and other equivalent embodiments are possible therefrom. Accordingly, the true scope of protection of the present invention should be determined only by the appended claims.

According to an embodiment of the present invention, a useful effect capable of securing at least one among accuracy, miniaturization, and low power consumption of clock signal recovery in a high-speed communication environment is implemented.

In particular, since the clock signal can be recovered only with a loop interruption circuit and a delay circuit configured of transistors, accuracy and efficiency of clock signal recovery can be improved, and it is advantageous in reducing the area and power consumption.

DESCRIPTION OF REFERENCE CHARACTERS

1000: Signal receiving circuit
11: First AND gate
12: Second AND gate
13: Third AND gate
21: First pulse generator
22: Second pulse generator
23: Third pulse generator
100: Clock signal recovery unit
110: Loop interruption circuit
111: Input node
112: Output node
120: Delay circuit
130: Keeper
131: NAND gate
132: Inverter
RX_AB: First differential signal
RX_BC: Second differential signal
RX_CA: Third differential signal
pulAB: First pulse
pulBC: Second pulse
pulCA: Third pulse
pulsAB: First inversion pulse
pulbBC: Second inversion pulse
pulsCA: Third inversion pulse
RCLK: Recovery clock signal
RCLKD: Recovery clock delay signal
$t_D$: First delay time
$t_{D2}$: Second delay time
$t_{skew}$: Timing skew
UI: Unit interval
$t_{inj}$: Injection delay
2000: Signal receiving device
1100: Control unit
1200: First to N-th clock recovery modules
1300: Logic operation unit

What is claimed is:

1. A signal receiving circuit that receives first to third input signals, each having a different signal level at each unit interval (UI), the circuit comprising:
   a first pulse generator for receiving a first differential signal obtained by subtracting the second input signal from the first input signal, and generating a first pulse that is high (H) at an edge of the first differential signal;
   a second pulse generator for receiving a second differential signal obtained by subtracting the third input signal from the second input signal, and generating a second pulse that is high (H) at an edge of the second differential signal;
   a third pulse generator for receiving a third differential signal obtained by subtracting the first input signal from the third input signal, and generating a third pulse that is high (H) at an edge of the third differential signal; and
   a clock signal recovery unit for generating a recovery clock signal and a recovery clock delay signal, which is a signal obtained by delaying the recovery clock signal as much as a first delay time, using at least one of pulses including the first pulse, the second pulse, the third pulse, a first inversion pulse which is an inversion signal of the first pulse, a second inversion pulse which is an inversion signal of the second pulse, and a third inversion pulse, which is an inversion signal of the third pulse, wherein
   the clock signal recovery unit includes:
   a loop interruption circuit including an input node and an output node and turned on and off by at least one of the pulses; and
   a delay circuit having an input terminal connected to the output node and an output terminal connected to the input node, wherein
   a signal value of the input node and a signal value of the output node are in an inverse relationship.

2. The circuit according to claim 1, wherein the loop interruption circuit includes:
a first PMOS transistor having a gate connected to the input node and one end connected to the output node;
a first NMOS transistor having a gate connected to the input node and one end connected to the output node;
a second PMOS transistor, a third PMOS transistor, and a fourth PMOS transistor, each having one end connected to the other end of the first PMOS transistor, and a gate to which the first inversion pulse, the second inversion pulse, or the third inversion pulse is applied; and
a second NMOS transistor, a third NMOS transistor, and a fourth NMOS transistor, each having one end connected to the other end of the first NMOS transistor, and a gate to which the first pulse, the second pulse, or the third pulse is applied.

3. The circuit according to claim 1, wherein the loop interruption circuit includes:
first to third NMOS transistors, each having one end connected to the input node, and the other end connected to the output node; and
first to third PMOS transistors, each having one end connected to the input node, and the other end connected to the output node, wherein
the first pulse is applied to a gate of the first NMOS transistor, the second pulse is applied to a gate of the second NMOS transistor, the third pulse is applied to a gate of the third NMOS transistor, the first inversion pulse is applied to a gate of the first PMOS transistor, the second inversion pulse is applied to a gate of the second PMOS transistor, and the third inversion pulse is applied to a gate of the third PMOS transistor.

4. The circuit according to claim 1, wherein the clock signal recovery unit further includes a keeper connected to the output node to prevent shaking of a signal output to the output node.

5. The circuit according to claim 1, wherein the loop interruption circuit further includes a plurality of transistors, wherein when the pulses are applied to the transistors, the transistors begin to operate after an injection delay elapses, and the first delay time is larger than a timing skew of the edges of the first to third differential signals and smaller than a value obtained by subtracting the injection delay from the unit interval.

6. A signal receiving device including the signal receiving circuit according to claim 1, the device comprising:
first to N-th clock recovery modules operating in a half-rate clock recovery method; and
a logic operation unit for performing logic operation on the recovery clock signal output from the first to N-th clock recovery modules and outputting the recovery clock signal, wherein the first to N-th clock recovery modules generate a recovery clock delay signal obtained by delaying the recovery clock signal as much as a second delay time, wherein
the second delay time is larger than the unit interval, and
the first to N-th clock recovery modules are sequentially enabled at each unit interval.

7. A method of recovering a clock of a received signal, the method comprising:
a step of receiving first to third input signals, each having a different signal level at each unit interval;
a step of generating a first differential signal that is a differential signal of the first input signal and the second input signal, a second differential signal that is a differential signal of the second input signal and the third input signal, and a third differential signal that is a differential signal of the third input signal and the first input signal; and
a clock signal recovery step of generating a recovery clock signal using at least one of pulses, including first to third pulses that are high (H) at an edge of each of the first to third differential signals, and first to third inversion pulses that are inversion signals of the first to third pulses, wherein
the clock signal recovery step is performed by a clock signal recovery unit including a loop configured of a loop interruption circuit and a delay circuit, in which the loop interruption circuit includes an input node and an output node, and includes the steps of:
generating the recovery clock signal as the loop interruption circuit is turned on when one of the first to third pulses becomes high (H);
generating, by the delay circuit, a recovery clock delay signal obtained by delaying the recovery clock signal as much as a first delay time; and
inputting the recovery clock delay signal into the input node, wherein
a signal value of the input node and a signal value of the output node are in an inverse relationship.

8. The method according to claim 7, wherein the clock signal recovery step includes the steps of outputting a high signal to the output node of the loop interruption circuit when one of the first to third pulses becomes high (H), outputting a high signal to the output node of the loop interruption circuit when one of the first to third pulses becomes high (H) before the first delay time elapses, and outputting a low signal to the output node of the loop interruption circuit when one of the first to third pulses becomes high (H) after the first delay time elapses.

* * * * *